US009394411B2

(12) United States Patent
Chang et al.

(10) Patent No.: US 9,394,411 B2
(45) Date of Patent: Jul. 19, 2016

(54) METHODS FOR ANNEALING BLOCK COPOLYMERS AND ARTICLES MANUFACTURED THEREFROM (71) Applicants: Dow Global Technologies LLC, Midland, MI (US); ROHM AND HAAS ELECTRONIC MATERIALS LLC, Marlborough, MA (US)

(72) Inventors: Shih-Wei Chang, Natick, MA (US); Jong Keun Park, Westborough, MA (US); John W. Kramer, Mt. Pleasant, MI (US); Erin B. Vogel, Midland, MI (US); Phillip D. Hustad, Natick, MA (US); Peter Trefonas, III, Medway, MA (US)

(73) Assignees: DOW GLOBAL TECHNOLOGIES LLC, Midland, MI (US); ROHM AND HAAS ELECTRONIC MATERIALS LLC, Marlborough, MA (US)

( * ) Notice: Subject to any disclaimer, the term of this patent is extended or adjusted under 35 U.S.C. 154(b) by 0 days.

(21) Appl. No.: 14/580,300

(22) Filed: Dec. 23, 2014

(65) Prior Publication Data
US 2015/0183935 A1 Jul. 2, 2015

Related U.S. Application Data (60) Provisional application No. 61/922,204, filed on Dec. 31, 2013.

(51) Int. Cl.
*C08G 77/442* (2006.01)
*B29C 71/00* (2006.01)
(Continued)

(52) U.S. Cl.
CPC .............. *C08G 77/442* (2013.01); *B29C 59/14* (2013.01); *B29C 71/0009* (2013.01);
(Continued)

(58) Field of Classification Search
None
See application file for complete search history.

(56) References Cited

U.S. PATENT DOCUMENTS 3,051,684 A   8/1962   Morton
3,257,476 A   6/1966   Tobolsky
(Continued)

FOREIGN PATENT DOCUMENTS

WO   WO2009137678 A1   11/2009

OTHER PUBLICATIONS

Bosman et al., "A Modular Approach toward Functionalized Three-Dimensional Macromolecules: From Synthetic Concepts to Practical Applications" J. Am. Chem. Soc., 2003, 125 (3), 715-728.
(Continued)

*Primary Examiner* — Robert S Loewe
(74) *Attorney, Agent, or Firm* — Cantor Colburn LLP (57) ABSTRACT Disclosed herein is a block copolymer comprising a first block derived from a vinyl aromatic monomer; where the vinyl aromatic monomer has at least one alkyl substitution on an aromatic ring; a second block derived from a siloxane monomer; where a chi parameter that measures interactions between the first block and the second block is 0.03 to 0.18 at a temperature of 200° C. Disclosed herein is a method comprising polymerizing a vinyl aromatic monomer to form a first block; and polymerizing a second block onto the first block to form a block copolymer; where the second block is derived by polymerizing a siloxane monomer; and where the block copolymer has a chi parameter of 0.03 to 0.18 at a temperature of 200° C.; where the chi parameter is a measure of interactions between the first block and the second block of the copolymer.

15 Claims, 6 Drawing Sheets (51) Int. Cl.
*B29C 71/02* (2006.01)
*B29C 59/14* (2006.01)
*B81C 1/00* (2006.01)
*G03F 7/00* (2006.01)
*B29C 59/02* (2006.01)

(52) U.S. Cl.
CPC .................. *B29C 71/02* (2013.01); *B81C 1/00* (2013.01); *G03F 7/0002* (2013.01); *B29C 2059/023* (2013.01); *B29C 2071/022* (2013.01)

(56) References Cited

U.S. PATENT DOCUMENTS

| | | | | |
|---|---|---|---|---|
| 3,483,270 | A * | 12/1969 | Bostick | C08G 77/42 525/104 |
| 3,665,052 | A * | 5/1972 | Saam | C08G 77/442 525/106 |
| 3,890,405 | A * | 6/1975 | Kendrick | C08G 77/442 525/106 |
| 3,974,078 | A | 8/1976 | Crystal | |
| 4,550,139 | A * | 10/1985 | Arkles | C08L 33/12 523/107 |
| 5,281,666 | A * | 1/1994 | Hoxmeier | C08G 77/442 525/105 |
| 5,296,574 | A * | 3/1994 | Hoxmeier | C08G 77/442 525/100 |
| 5,587,223 | A | 12/1996 | White | |
| 5,686,549 | A | 11/1997 | Grainger | |
| 5,948,470 | A | 9/1999 | Harrison | |
| 6,025,117 | A | 2/2000 | Nakano | |
| 6,565,763 | B1 | 5/2003 | Asakawa | |
| 6,746,825 | B2 | 6/2004 | Nealey | |
| 7,799,416 | B1 | 9/2010 | Chan | |
| 7,901,866 | B2 | 3/2011 | Ito | |
| 8,268,732 | B2 | 9/2012 | Sills | |
| 8,304,493 | B2 * | 11/2012 | Millward | C08F 287/00 525/105 |
| 2006/0249784 | A1 | 11/2006 | Black | |
| 2007/0049155 | A1 | 3/2007 | Moro | |
| 2008/0193658 | A1 * | 8/2008 | Millward | B81C 1/00031 427/401 |
| 2008/0233435 | A1 | 9/2008 | Hasegawa | |
| 2008/0311402 | A1 * | 12/2008 | Jung | B82Y 10/00 428/409 |
| 2009/0182093 | A1 | 7/2009 | Cheng | |
| 2011/0256359 | A1 | 10/2011 | Colburn | |
| 2011/0272381 | A1 | 11/2011 | Millward | |
| 2012/0088188 | A1 | 4/2012 | Trefonas | |
| 2012/0107583 | A1 | 5/2012 | Xiao | |
| 2013/0045361 | A1 | 2/2013 | Willson | |
| 2013/0171429 | A1 | 7/2013 | Liu | |
| 2013/0209344 | A1 | 8/2013 | Chang | |
| 2013/0209755 | A1 | 8/2013 | Hustad | |
| 2014/0335324 | A1 | 11/2014 | Kim | |
| 2015/0184024 | A1 * | 7/2015 | Chang | C09D 183/10 428/447 |

OTHER PUBLICATIONS

Hahm, J. and Siebener, S. J., "Cylinder Alignment in Annular Structures of Microphase-Separated Polystyrene-b-Poly (methyl methacrylate)" Langmuir, 2000, 16 (11), pp. 4766-4769.

Han, E.; Stuen, K. O.; La, Y. H.; Nealey, P. F.; Gopalan, P., "Effect of Composition of Substrate-Modifying Random Copolymers on the Orientation of Symmetric and Asymmetric Diblock Copolymer Domains" Macromolecules 2008, 41 (23), 9090-9097.

Jung, S. J. and Ross, C. A., "Orientation-Controlled Self-Assembled Nanolithography Using a Polystyrene-Polydimethylsiloxane Block Copolymer" Nano Letters, 2007, 7, pp. 2046-2050.

Li et al., "Confinement of Block Copolymers on Patterned Surfaces" Macromolecules, 1997, 30 (26), pp. 8410-8419.

Liu, et al. "Fabrication of Lithographically Defined Chemically Patterned Polymer Brushes and Mats" Macromolecules 2011, 44 (7), pp. 1876-1885.

Mansky et al. "Nanometer Scale Periodic Modulation of a 2-D Electron System with Block Copolymers" Bull. Am. Phys. Soc. 36 (1991) 1051.

Mansky, P.; Chaikin, P. M.; Thomas, E. L. J. "Monolayer Films of Diblock Copolymer Microdomains for Nanolithographic Applications" Journal of Material Science 30 (1995) pp. 1987-1992.

Mansky, P.; Liu, Y.; Huang, E.; Russell, T. P.; Hawker, C. J., "Controlling Polymer-Surface Interactions with Random Copolymer Brushes" Science 1997, 275 (5305), 1458-1460.

Nealey et al., "Fabrication of Lithographically Defined Chemically Patterned Polymer Brushes and Mats" Macromolecules, 2011, 44, pp. 1876-1885.

Park et al., "Double textured cylindrical block copolymer domains via directional solidification on a topographically patterned substrate" Appl. Phys. Lett., 2001, 79, pp. 848-850.

Quirk et al., "Characterization of the Functionalization Reaction Product of Poly(styryl)lithium with Ethylene Oxide" Journal of Polymer Science: Part A: Polymer Chemistry, vol. 26, 2031-2037 (1988).

Russell et al., "Nonoscopic Templates from Oriented Block Copolymer Films" Advanced Materials (2000), 12, pp. 787-791.

Schulz et al., "Graft Polymers with Macromonomers. I. Synthesis from Methacrylate-Terminated Polystyrene" Journal of Applied Polymer Science, vol. 27, pp. 4773-4786 (1982).

Segalman et al., "Graphoepitaxy of Spherical Domain Block Copolymer Films" Advanced Materials (2001) 13, pp. 1152-1155.

Sundrani et al., "Guiding Polymers to Perfection: Macroscopic Alignment of Nanoscale Domains" Nano Letters (2004) 4, 273-276.

Sundrani et al., "Spontaneous Spatial Alignment of Polymer Cylindrical Nanodomains on Silicon Nitride Gratings" Macromolecules (2002) 35, 8531-8539.

Yerushalmi-Rozen et al., "Suppression of Rupture in Thin, Nonwetting Liquid Films" Science Feb. 11, 1994: vol. 263, pp. 793-795.

* cited by examiner

METHODS FOR ANNEALING BLOCK COPOLYMERS AND ARTICLES MANUFACTURED THEREFROM

CROSS REFERENCE TO RELATED APPLICATIONS

This U.S. Non-Provisional application claims the benefit of U.S. Provisional Application Ser. No. 61/922,204 filed on Dec. 31, 2013, the entire contents of which are hereby incorporated by reference.

BACKGROUND

This disclosure is related to polyalkylstyrene-polysiloxane block copolymers, methods of manufacture thereof and to articles comprising the same. In particular, this disclosure is related to polyalkylstyrene-polysiloxane block copolymers used for improved nano lithography patterning.

Modern electronic devices are moving toward utilization of structures that have a periodicity of less than 40 nanometers. The ability to shrink the size and spacing of various features on a given substrate (e.g., gates in field effect transistors) is currently limited by the wavelength of light used to expose photoresists (i.e., 193 nm). These limitations create a significant challenge for the fabrication of features having a critical dimension (CD) of <50 nm.

Block copolymers have been proposed as one solution to formation of patterns with periodicity of less than 40 nanometers. Block copolymers form self-assembled nanostructures in order to reduce the free energy of the system. Nanostructures are those having average largest widths or thicknesses of less than 100 nanometers. This self-assembly produces periodic structures as a result of the reduction in free energy. The periodic structures can be in the form of domains, lamellae or cylinders. Because of these structures, thin films of block copolymers provide spatial chemical contrast at the nanometer-scale and, therefore, they have been used as an alternative low-cost nano-patterning material for generating periodic nanoscale structures.

Figure 1A:
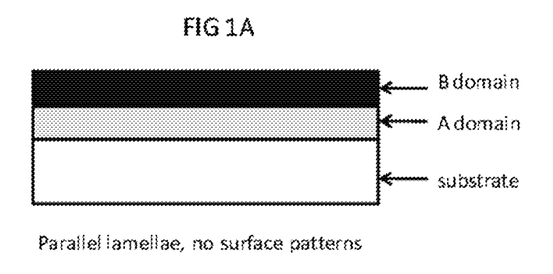
FIGS. 1A and 1B depict examples of lamella forming block copolymers that are disposed upon a substrate.
Figure 1B:
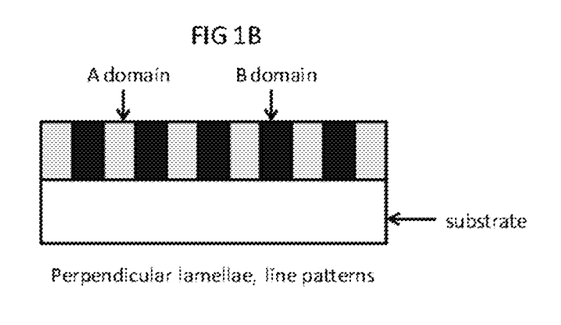

Many attempts have been made to develop copolymers and processes for patterning. FIGS. 1A and 1B depict examples of lamella forming block copolymers that are disposed upon a substrate. The block copolymer comprises a block A and a block B that are reactively bonded to each other and that are immiscible with each other. The alignment of lamellae domains can be either parallel (FIG. 1A) or perpendicular (FIG. 1B) to the surface of a substrate surface upon which they are disposed. The perpendicularly oriented lamellae provide nanoscale line patterns, while there is no surface pattern created by parallel oriented lamellae.

Where lamellae form parallel to the plane of the substrate, one lamellar phase forms a first layer at the surface of the substrate (in the x-y plane of the substrate), and another lamellar phase forms an overlying parallel layer on the first layer, so that no lateral patterns of microdomains and no lateral chemical contrast form when viewing the film along the perpendicular (z) axis. When lamellae form perpendicular to the surface, the perpendicularly oriented lamellae provide nanoscale line patterns. Cylinder forming block copolymers, on the other hand, provide nanoscale line patterns when the cylinders form parallel to the surface and hole or post patterns when the cylinders form perpendicular to the surface. Therefore, to form a useful pattern, control of the orientation of the self-assembled microdomains in the block copolymer is desirable.

The block copolymer is desirably annealed with heat (in the presence of an optional solvent), which allows for microphase separation of the polymer blocks A and B at a temperature above the glass transition temperature and below the order to disorder transition temperature. The annealed film can then be further developed by a suitable method such as immersion in a solvent/developer or by reactive ion etching which preferentially removes one polymer block and not the other to reveal a pattern that is commensurate with the positioning of one of the blocks in the copolymer.

The use of conventional block copolymers present difficulties in orientation control and long range ordering during the self assembly process. Diblock copolymers of poly(styrene) and poly(dimethylsiloxane) (PS-b-PDMS) offer promise for application in the patterning of nanoscale dimensions (especially sub-45 nm) using directed self assembly techniques. The etch selectivity between the polystyrene and poly(dimethylsiloxane) domains makes these materials useful for patterning. Conventional wisdom in the art, however, is that the use of PS-b-PDMS block copolymers in such operations cannot effectively be thermally annealed due to the large incompatibility between the polystyrene and polydimethylsiloxane blocks. This is especially apparent in PS-b-PDMS materials that display a spacing of 30 nm or larger. For any block copolymer system, as the interdomain spacing increases, the material becomes more difficult to anneal to low defectivity. Accordingly, those in the art have developed a variety of alternative techniques for processing of block copolymers like poly(styrene)-b-poly(dimethylsiloxane) block copolymers. For example, in U.S. Patent Publication No. 2011/0272381; Millward, et al., disclose a solvent annealing method for processing diblock copolymer films such as poly(styrene)-b-poly(dimethylsiloxane).

On the other hand, block copolymers comprising polystyrene and poly(2-vinyl pyridine) (PS-b-P2VP) can be annealed to low defectivity at 30 nm pitch under thermal annealing processes, but these materials lack inherent etch selectivity between the component blocks. Accordingly, metal staining of the P2VP is required to impart etch selectivity to enable pattern transfer with these materials. This process swells the poly(2-vinyl pyridine) domain, resulting in damage to the morphology that is manifested by an unacceptable line edge roughness (LER) for commercial use.

Notwithstanding, there remains a need for new copolymer compositions for use in patterning substrates. In particular, there remains a need for new copolymer compositions that enable patterning on intermediate length scales of 20 to 40 nm and that preferably exhibit a fast annealing profile with low defect formation.

It is therefore desirable to find block copolymers that contain polystyrene and polydimethylsiloxane that can generate self-assembled films having domain sizes of less than 25 nanometers with a periodicity of less than 50 nanometers. Additionally, it is desirable to find block copolymers that contain polystyrene and polydimethylsiloxane that can deliver low defects at 50 nm or less pitch under thermal annealing processes without a metal staining process, as this would save additional expensive processing steps and should lead to lower (better) line width roughness.

SUMMARY

Disclosed herein is a block copolymer comprising a first block derived from a vinyl aromatic monomer; where the vinyl aromatic monomer has at least one alkyl substitution on an aromatic ring; a second block derived from a siloxane monomer; where a chi parameter that measures interactions between the first block and the second block is 0.03 to 0.18 at a temperature of 200° C.

Disclosed herein is a method comprising polymerizing a vinyl aromatic monomer to form a first block; and polymerizing a second block onto the first block to form a block copolymer; where the second block is derived by polymerizing a siloxane monomer; and where the block copolymer has a chi parameter of 0.03 to 0.18 at a temperature of 200° C.; where the chi parameter is a measure of interactions between the first block and the second block of the copolymer.

DETAILED DESCRIPTION

As used herein, "phase-separate" refers to the propensity of the blocks of block copolymers to form discrete microphase-separated domains, also referred to as "microdomains" or "nanodomains" and also simply as "domains". The blocks of the same monomer aggregate to form periodic domains, and the spacing and morphology of domains depends on the interaction, size, and volume fraction among different blocks in the block copolymer. Domains of block copolymers can form during application, such as during a spin-casting step, during a heating step, or can be tuned by an annealing step. "Heating", also referred to herein as "baking", is a general process wherein the temperature of the substrate and coated layers thereon is raised above ambient temperature. "Annealing" can include thermal annealing, thermal gradient annealing, solvent vapor annealing, or other annealing methods. Thermal annealing, sometimes referred to as "thermal curing" can be a specific baking process for fixing patterns and removing defects in the layer of the block copolymer assembly, and generally involves heating at elevated temperature (e.g., 150° C. to 400° C.), for a prolonged period of time (e.g., several minutes to several days) at or near the end of the film-forming process. Annealing, when performed, is used to reduce or remove defects in the layer (referred to as a "film" hereinafter) of microphase-separated domains.

The self-assembling layer comprising a block copolymer having at least a first block and a second block that forms domains through phase separation. "Domain", as used herein, means a compact crystalline, semi-crystalline, or amorphous region formed by corresponding blocks of the block copolymer, where these regions may be lamellar, cylindrical, or spherical and are formed orthogonal or perpendicular to the plane of the surface of the substrate and/or to the plane of a surface modification layer disposed on the substrate, or alternatively formed parallel or in plane with the substrate. In an embodiment, the domains may have an average largest dimension of about 1 to about 25 nanometers (nm), specifically about 5 to about 22 nm, and still more specifically about 7 to about 20 nm.

The term "$M_N$" used herein and in the appended claims in reference to a block copolymer of the present invention is the number average molecular weight of the block copolymer (in g/mol) determined according to the method used herein in the Examples.

The term "MW" used herein and in the appended claims in reference to a block copolymer of the present invention is the weight average molecular weight of the block copolymer (in g/mol) determined according to the method used herein in the Examples.

The term "PDI" or "Ð" used herein and in the appended claims in reference to a block copolymer of the present invention is the polydispersity (also called polydispersity index or simply "dispersity") of the block copolymer determined according to the following equation:

$$PDI = \frac{M_W}{M_N}.$$

As used herein, PtBS-b-PDMS denotes block copolymers of poly(4-tert-butylstyrene) and polydimethylsiloxane. As used herein, PS-b-PDMS denotes block copolymers of polystyrene and polydimethylsiloxane.

The transition term "comprising" is inclusive of the transition terms "consisting of" and "consisting essentially of".

The term "and/or" is used herein to mean both "and" as well as "or". For example, "A and/or B" is construed to mean A, B or A and B.

Disclosed herein is a block copolymer that comprises a block derived from the polymerization a vinyl aromatic monomer and a block derived from the polymerization of a siloxane monomer. In an exemplary embodiment, the vinyl aromatic monomer is an aklylstyrene, while the siloxane monomer is an alkyl siloxane. The block copolymer disclosed herein has a lower chi parameter than other similar block copolymer and this permits the block copolymer to be annealed at relatively low temperatures and shorter times to approach equilibrium.

Disclosed herein is a block copolymer comprising a first block polymer (hereinafter "first block" or "first block of the copolymer") and a second block polymer (hereinafter "second block" or "second block of the copolymer") in which the first and second block are chemically dissimilar and are characterized by an energetic penalty of dissolving one block into the other block. This energetic penalty is characterized by the Flory-Huggins interaction parameter or "chi" (denoted by $\chi$) and is an important factor in determining microphase segregation behavior in block copolymers. Accordingly, the $\chi$ value of a block copolymer defines a tendency of the block copolymer to segregate into microdomains as a function of the block copolymer's weight, chain length, and/or degree of polymerization. The chi parameter can often be approximated from the square of the difference in Hildebrand solubility parameters of the respective polymers of the block copolymer. In an exemplary embodiment, the chi parameter has a value of 0.03 to 0.18 at a temperature of 200° C.

As used herein, the $\chi$ parameter denotes the segment-segment interaction parameter associated with a segment volume of 0.118 cubic nanometers (nm3). The molecular weight of a segment, mo, in units of g/mol is equal to the segment volume multiplied by the polymer density and divided by Avogadro's number. Also as used herein, the degree of polymerization, N, is defined as the number of segments per block copolymer molecule and MN=N×mo.

A greater chi parameter between the first block of the copolymer with respect to the second block of the copolymer promotes the formation of smaller, highly periodic lamellar and/or cylindrical domains, which can be used to produce periodic structures in a substrate upon which the copolymer is disposed. In an exemplary embodiment, the periodic structures in the substrate are produced via nanolithography. In one embodiment, the first block of the copolymer is a block derived from a vinyl aromatic monomer while the second block of the copolymer is derived from a siloxane monomer. In one exemplary embodiment, the vinyl aromatic monomer is an alkylstyrene monomer, while the siloxane monomer is an alkyl siloxane monomer. In another exemplary embodiment, the alkylstyrene monomer is 4-tert-butyl styrene, while the alkyl siloxane monomer is dimethyl siloxane. In an exemplary embodiment, the first block of the copolymer is a poly (4-tert-butyl styrene), while the second block of the copolymer is polydimethylsiloxane. In one embodiment, the first block of the copolymer may contain a percentage (about 1 to about 50 mole percent) of polystyrenes other than poly(4-tert-butyl styrene), while the second block of the copolymer may contain a percentage (about 1 to about 50 mole percent) of polysiloxanes other than polydimethylsiloxane.

The first block of the copolymer and the second block of the copolymer both have a narrow polydispersity index and as a result form block copolymers that display a high degree of periodicity. The copolymers have lamellar and/or cylindrical morphologies and can align perpendicular to the surface of a substrate upon which they are disposed, thus making them useful for advanced semiconductor patterning. These block copolymers can be used for creating features on a substrate (upon which they are disposed) that are less than or equal to about 25 nanometers, specifically less than or equal to about 20 nanometers. The block copolymer can be further treated via annealing to self-assemble into morphologies that display improved long range order when compared with a comparative copolymer that has the same composition but is not annealed. This feature advantageously permits the block-copolymer to be used as a photoresist with variable interdomain spacings for different lithographic applications.

Disclosed herein too is a method for manufacturing the block copolymer. The method involves using controlled or living polymerization to synthesize the first block of the copolymer. The second block of the copolymer may have a narrow polydispersity index and is generally synthesized by condensation polymerization in a separate reactor from the first block copolymer. The first block of the copolymer is then reacted with the second block of the copolymer in a separate reactor to form the block copolymer.

The block copolymer can be a multiblock copolymer. In one embodiment, the multiblocks can include diblocks, triblock, tetrablocks, and so on. The blocks can be part of a linear copolymer, a branched copolymer where the branches are grafted onto a backbone (these copolymers are also sometimes called "comb copolymers"), a star copolymer, or the like. In an exemplary embodiment, the block copolymer is a linear diblock copolymer.

The first block of the copolymer is a block derived from a vinyl aromatic monomer. The vinyl aromatic monomers that can be polymerized to produce the first block of the copolymer of the block copolymer are alkylstyrenes. Examples of suitable alkylstyrenes are o-methylstyrene, p-methylstyrene, m-methylstyrene, α-methylstyrene, o-ethylstyrene, m-ethylstyrene, p-ethylstyrene, α-methyl-p-methylstyrene, 2,4-dimethylstyrene, monochlorostyrene, p-tert-butylstyrene, 4-tert-butylstyrene, or the like, or a combination comprising at least one of the foregoing alkylstyrene monomers. An exemplary alkylstyrene monomer is 4-tert-butylstyrene. An exemplary first block of the copolymer is poly(4-tertbutyl styrene). In one embodiment, the first block of the copolymer may contain about 2 to about 10 weight percent vinyl aromatic species that are not derived from 4-tert-butylstyrene. The first block of the copolymer can also be a polymer derived from a vinyl aromatic monomer that after polymerization is hydrogenated to yield a cycloaliphatic group, for example poly(4-tert-butylcyclohexylethylene) formed by hydrogenation of poly(4-tert-butylstyrene).

End groups are then frequently reacted onto the first block to facilitate a further reaction with the second block. Examples of end groups are reactive functionalities such as azides, acetylenes, alkyl acid chlorides, alkyl sulfonyl chlorides, alcohols, thiols or combinations thereof. Alternatively, the terminus of the first block is carefully maintained as a reactive anion lithium salt, maintaining its reactivity for the polymerization of second block onto the first block.

In an embodiment, the block copolymer may be manufactured by sequential anionic polymerization or alternatively by manufacturing the two blocks (the first block and the second block) independently and then reacting them together to form the block copolymer. In an embodiment, click chemistry can be used to react the two blocks to form the block copolymer. For example, the first block that is derived from the polymerization of the vinyl aromatic species can be endcapped with an alkyne endgroup, while the second block derived from the polymerization of the siloxane can be endcapped with an azide endgroup. Click coupling can be used to react the first block with the second block to produce the block copolymer.

With further regard to click chemistry, one end of the polymerized siloxane monomer can contain an azide, an acetylene, an acid chloride or sulfonyl chloride, an alcohol, a thiol, or the like, provided that the group chosen is reactive to and forms a covalent bond with the reactive site on the terminus of the first block. The block copolymer is then formed by the reaction of the reactive terminus on the first block with the reactive terminus on the second block, yielding a linear block copolymer.

In another embodiment, anionic polymerization, which is a preferred mode for producing the block copolymer, may be used to react the living polystyryl-lithium with the corresponding cyclotrisiloxane (e.g. hexamethylcyclotrisiloxane, or D3, the polysiloxane precursor) directly. In another embodiment, a "reactivity attenuating agent", such as 2,2,5,5-tetramethyl-1-oxa-2,5-disilacyclopentane may be added to the living polystyryl-lithium before adding the cyclotrisiloxane.

In one preferred embodiment, the reactive anion lithium salt of the first block is directly used to initiate the polymerization of the second block. One preferred embodiment of this method uses direct ring opening polymerization of hexam- ethylcyclotrisiloxane or tetramethylcyclodisiloxane to form the polydimethylsiloxane. A more preferred embodiment first reacts the carefully maintained reactive anion lithium salt of the first block with 2,2,5,5-tetramethyldisilafuran, and then further polymerizes using direct ring opening polymerization of hexamethylcyclotrisiloxane or tetramethylcyclodisiloxane to form the polydimethylsiloxane.

The weight average molecular weight (Mw) of the first block is about 2000 grams per mole to about 200,000 grams per mole, specifically about 5,000 grams per mole to about 100,000 grams per mole and more specifically about 7,000 grams per mole to about 70,000 grams per mole as measured by multi-angle laser light scattering (MALLS) gel permeation chromatography (GPC) instrument using THF as the mobile phase at a flow of 1 milliliter per minute (mL/min).

The polydispersity index of the first block is less than or equal to about 1.20, specifically less than or equal to about 1.10 and specifically less than or equal to about 1.08 when determined by size exclusion chromatography (SEC) with chloroform as the mobile phase (at 35° C. and a flow rate of 1 mL/min).

The first block comprises about 10 to about 90 volume percent of the total volume of the copolymer. Specifically, if a lamellar composition is desired, the first block comprises about 40 to about 60 volume percent, and more specifically about 45 to about 55 volume percent of the total volume of the copolymer. If a cylindrical composition is desired, the first block comprises about 65 to about 85 volume percent, and more specifically about 70 to about 80 volume percent of the total volume of the copolymer. In an exemplary embodiment, the first block comprises about 75 volume percent of the total volume of the copolymer. In another exemplary embodiment, the first block comprises about 50 volume percent of the total volume of the copolymer.

The second block of the copolymer is a block derived from a siloxane monomer having the structure of formula (1)

(1)

wherein each R is independently a $C_1$-$C_{10}$ alkyl, a $C_3$-$C_{10}$ cycloalkyl, a $C_6$-$C_{14}$ aryl, a $C_7$-$C_{13}$ alkylaryl or a $C_7$-$C_{13}$ arylalkyl. Combinations of the foregoing R groups can be present in the same monomer. The degree of polymerization n in the formula (1) can be 25 to 5,000, specifically 30 to 3,000, more specifically 50 to 1,000.

In an exemplary embodiment, the second block comprises a polydimethylsiloxane having a number average molecular weight of 10,000 to 80,000 grams per mole, specifically 15,000 to 40,000 grams per mole.

The second block comprises about 10 to about 90 volume percent of the total volume of the copolymer. Specifically, if a lamellar composition is desired, the second block comprises about 60 to about 40 volume percent, and more specifically about 55 to about 45 volume percent of the total volume of the copolymer. If a cylindrical composition is desired, the second block comprises about 35 to about 15 volume percent, and more specifically about 30 to about 20 volume percent of the total volume of the copolymer. In an exemplary embodiment, the second block comprises about 25 volume percent of the total volume of the copolymer. In another exemplary embodiment, the second block comprises about 50 volume percent of the total volume of the copolymer.

The polydispersity index of the block copolymer is less than or equal to about 1.20, specifically less than or equal to about 1.15 and specifically less than or equal to about 1.10 when determined by size exclusion chromatography (SEC) with tetrahydrofuran (THF) as the mobile phase (at 35° C. and a flow rate of 1 mL/min).

The weight average molecular weight of the block copolymer is about 3 to about 150, specifically about 7.5 to about 120, specifically about 10 to about 100, and more specifically about 15 to about 80 kilograms per mole as determined using multi-angle laser light scattering gel permeation chromatography and the polydispersity index. In an exemplary embodiment, it is desirable for the block copolymer to have a weight average molecular weight of about 3 to about 120 kilograms per mole.

The block copolymer has an interdomain spacing as measured by small angle x-ray scattering of less than or equal to about 60 nanometers, specifically less than or equal to about 50 nanometers, more specifically less than or equal to about 40 nanometers, and more specifically less than or equal to about 36 nanometers.

The block copolymer can be manufactured in a batch process or in a continuous process. The batch process or the continuous process can involve a single or multiple reactors, single or multiple solvent and single or multiple catalysts (also termed initiators). In one embodiment, in one method of manufacturing the block copolymer, a first monomer is polymerized anionically to form the first block of the copolymer in a first reactor in the presence of a first solvent and a first initiator. A first endcapping agent is then introduced into the first reactor to quench the anionic reaction in the first reactor and to prevent undesirable side reactions.

The second monomer is subject to condensation polymerization to form the second block of the copolymer in the presence of a second solvent and a second catalyst. The second monomer may be obtained by the polymerization of a monomer or by the ring opening of a cyclic siloxane polymer followed by the condensation polymerization of the polymer to form the second block of the copolymer. The second block may be polymerized in a second reactor. When the second block has reached a desirable molecular weight, the reaction may be quenched using an acid or base to neutralize the catalyst. The first block and the second block are then covalently bonded to form the block copolymer. In one embodiment, the first block and the second block are then copolymerized (i.e., chemically (covalently) bonded) to form the block copolymer in the first reactor or the second reactor. The first reactor, the first solvent and the first initiator can be the same or different from the second reactor, the second solvent and the second initiator. In an exemplary embodiment, the first reactor, the first solvent and the first initiator are different from the second reactor, the second solvent and the second initiator.

Suitable solvents for conducting the reaction are polar solvents, non-polar solvents, or combinations thereof. Examples of solvents are aprotic polar solvents, polar protic solvents, or non polar solvents. In one embodiment, aprotic polar solvents such as propylene carbonate, ethylene carbonate, butyrolactone, acetonitrile, benzonitrile, nitromethane, nitrobenzene, sulfolane, dimethylformamide, N-methylpyrrolidone, glycol ether acetates, propylene glycol monomethyl ether acetate, or the like, or combinations comprising at least one of the foregoing solvents may be used. In another embodiment, polar protic solvents such as water, methanol, acetonitrile, nitromethane, ethanol, propanol, isopropanol, butanol, or the like, or combinations comprising at least one of the foregoing polar protic solvents may also be used. Other non-polar solvents such a benzene, alkylbenzenes (such as toluene or xylene), methylene chloride, carbon tetrachloride, hexane, diethyl ether, tetrahydrofuran, or the like, or combinations comprising at least one of the foregoing solvents may also be used. Co-solvents comprising at least one aprotic polar solvent and at least one non-polar solvent may also be utilized to modify the swelling power of the solvent and thereby adjust the rate of reaction. In an exemplary embodiment, the first solvent is tetrahydrofuran. The solvent used for the block copolymer was propylene glycol monomethyl ether acetate (PGMEA).

The weight ratio of the solvent to the first monomer is about 5:1 to about 20:1, specifically about 7:1 to about 15:1, and more specifically about 8:1 to about 12:1.

In order to initiate polymerization of the first monomer to form the first block of the copolymer, it is desirable to use a first initiator that can initiate anionic polymerization of a vinyl aromatic compound. The first initiator is an aliphatic hydrocarbon alkali metal compound, an aromatic hydrocarbon alkali metal compound, an organic aminoalkali metal compound, or the like, or a combination comprising at least one of the foregoing first initiators.

Examples of the alkali metals include lithium, sodium, potassium, or the like, or a combination comprising at least one of the foregoing alkali metals. In an exemplary embodiment, the organic alkali metal compounds include an aliphatic and/or aromatic hydrocarbon lithium compound comprising 1 to about 20 carbon atoms, a compound comprising one lithium atom in a single molecule or dilithium, trilithium and tetralithium compounds comprising a plurality of lithium atoms in a single molecule.

In an exemplary embodiment, the first initiator is n-propyllithium, n-butyllithium, sec-butyllithium, tert-butyllithium, hexamethylenedilithium, butadienyldilithium, isoprenyldilithium, a reaction product of diisopropenylbenzene and sec-butyllithium, a reaction product of divinylbenzene, sec-butyllithium and a small amount of 1,3-butadiene, or the like, or a combination comprising at least one of the foregoing first initiators. An exemplary first initiator is sec-butyllithium.

In one embodiment, the first initiator is used in an amount of about 20 to about 2000 moles per mole of the first monomer. In an exemplary embodiment, the first initiator is used in an amount of about 70 to about 300 moles per mole of the first monomer.

The first monomer is reacted to form the first block of the copolymer at a temperature of about −100° C. to about 150° C., specifically about −80° C. to about 100° C. Reaction temperature is selected for the polymerization chemistry in order to minimize side reactions and provide polymer with narrow dispersity. This reaction may be conducted under a vacuum or at an elevated pressure. In one embodiment, the pressure in the reaction vessel is about 0.05 to about 10 kilograms per square centimeter, specifically about 0.07 to about 2 kilograms per square centimeter. The pressure may be applied by using a pressurized inert gas such as nitrogen, argon, carbon dioxide or the like to the reactor.

In one embodiment, the respective block polymers may be purified by a variety of methods prior to be reacted to form the block copolymer. Purification of the respective block polymers is optional. In another embodiment, the reactants, the respective block polymers, and the block copolymer may be purified prior to and after the reaction. Purification may include washing, filtration, precipitation, ion exchange, decantation, centrifugation, distillation, or the like, or a combination comprising at least one of the foregoing methods of purification.

In one exemplary embodiment, all reactants including the solvents, initiators and endcapping agents are purified prior to the reaction. It is generally desirable to use reactants, solvents and initiators that are purified to an amount of greater than or equal to about 99 wt % purity, specifically greater than or equal to about 99.5 wt % purity and more specifically greater than about or equal to about 99.9 wt % purity. In another exemplary embodiment, after sequential polymerization of the block copolymer, the block copolymer may be subjected to purification by methods that include washing, filtration, ion exchange, precipitation, decantation, centrifugation or distillation.

In one embodiment, the block copolymer can contain antioxidants, anti-ozonants, mold release agents, thermal stabilizers, levelers, viscosity modifying agents, free-radical quenching agents, other polymers or copolymers such as impact modifiers, or the like.

The block copolymer after purification may be dissolved in a solvent and then disposed upon the surface of a substrate to form a block copolymer film whose blocks are perpendicular in orientation to the surface of the substrate. In one embodiment, the surface of the substrate may contain a surface modification layer disposed thereon prior to the disposing of the block copolymer onto the surface of the substrate. The surface modification layer can be a block copolymer, a random copolymer, of a blend of homopolymers and form brushes on the surface of the substrate. The substrate can also be patterned such that some areas result in perpendicular orientation while others induce a parallel orientation of the block copolymer domains. The substrate can also be patterned such that some regions selectively interact, or pin, a domain of the block copolymer to induce order and registration of the block copolymer morphology. The substrate can also have topography that induces the alignment and registration of one or more of the domains of the block copolymer. The block copolymer of the invention after being disposed upon the substrate is optionally heated to a temperature of up to 400° C. for up to 4 hours to both remove solvent and form the domains in an annealing process. In an exemplary embodiment, the block copolymer is disposed upon the substrate and heated to a temperature of 220 to 360° C., specifically 250 to 320° C. for 0.5 minutes to 2 hours, specifically 1 minutes to 10 minutes. The annealing of the block copolymer can be used to vary the interdomain spacing (i.e., the periodicity) of the cylindrical and/or lamellar domains. The size of the domains can also be varied by the temperature and time of the annealing.

In some embodiments, the domains of the block copolymer form perpendicular to the substrate and the first block aligns to the pattern created on the first domain to the "pinning" feature on the substrate, and the second block forms a second domain on the substrate aligned adjacent to the first domain. Where the patterned substrate forms a sparse pattern, and hence the surface modification layer regions are spaced at an interval greater than an interval spacing of the first and second domains, additional first and second domains form on the surface modification layer to fill the interval spacing of the sparse pattern. The additional first domains, without a pinning region to align to, instead align perpendicular to the previously formed perpendicular orientation inducing surface modification layer, and additional second domains align to the additional first domains.

In other embodiments, the domains of the block copolymer are aligned in trench or hole patterns to form patterns with higher feature density than in the original guide pattern. For example, trenches are made using lithographic techniques, and then the trenches are filled with the block copolymer. After annealing, the block copolymer aligns to form a plurality of cylinders inside the trench. These cylinders serve as etch masks and enable formation of multiple lines within the original trench. Spherical domains can also be aligned in holes or trenches to create an ordered array of dots or posts inside the original features.

One of the domains of the block copolymer (formed from either the first block of the copolymer or the second block of the copolymer) may then be preferentially etched away. A relief pattern is then formed by removing either the first or second domain to expose an underlying portion of the surface modification layer. In an embodiment, removing is accomplished by a wet etch method, developing, or a dry etch method using a plasma such as an oxygen plasma. The block copolymer with at least one domain removed is then used as a template to decorate or manufacture other surfaces that may be used in fields such as electronics, semiconductors, and the like.

The invention is further illustrated by the following non-limiting examples.

EXAMPLES

Example 1

This example demonstrates the manufacturing of brushes that are disposed on a substrate. A block copolymer is then disposed upon the brushes. The brushes were hydroxyl terminated polydimethylsiloxane (OH terminated PDMS), hydroxyl terminated polystyrene (OH terminated PS), OH end functional poly(methylmethacrylate-random-trifluoroethylmethacrylate) (P(MMA-r-TFEMA)-OH), OH end functional poly(methylmethacrylate-random-dodecafluoroheptylmethacrylate)-OH brush (P(MMA-r-DFHMA)-OH). The synthesis or procuring of these materials is detailed below.

Synthesis of OH-Terminated PDMS

The Si—H terminated PDMS (4.0 g) and allyl alcohol (0.29 g, 4.9 mmol, 18 eq. based on silane) were combined in a 20 mL vial. The vial was placed under a blanket of N2, and a small scoop of 5% Pt/C was added to it. The vial was capped and heated to 110° C. for 15 hrs in a heating block. The crude reaction mixture was filtered through a frit, and 1 μm filter using hexanes to wash all the PDMS through. The polymer was then evacuated at 60° C. to remove hexanes and excess allyl alcohol to yield the desired PDMS-OH.

Procuring of OH Terminated Polystyrene

Hydroxyl end functional polystyrene with Mn=10 kg/mol was purchased from Scientific Polymer, and hydroxyl end functional polydimethylsiloxane with Mn=10 kg/mol was purchased from Dow Corning and used as received.

Synthesis of OH End Functional poly(methylmethacrylate-random-trifluoroethylmethacrylate (P(MMA-r-TFEMA)-OH)

A Schlenk flask was equipped with a magnetic stirring bar, 4,4'-di-tert-butyl-2,2'-bipyridyl (0.537 g), Cu(I)Br (0.144 g), methyl methacrylate (7.00 g), trifluoroethyl methacrylate (3.00 g), and toluene (10 g). The solution was sparged with argon for 15 minutes and then placed in a preheated oil bath at 90° C. Once the solution had come to equilibrium, the initiator (2-hydroxyethyl 2-bromo-2-methylpropanoate) (0.211 g) was added via syringe and the reaction was stirred at 90° C. After the polymerization was quenched, the mixture was diluted with THF and stirred with ion exchange beads to remove the catalyst. Once the solution was clear, it was filtered, concentrated to 50 wt %, and precipitated into excess cyclohexane. The polymer was collected and dried in a vacuum oven at 60° C. overnight. $^1$H NMR showed the polymer to have a composition of 69 wt % methyl methacrylate and 31 wt % trifluoroethyl methacrylate. Gel-permeation chromatography revealed a Mn=13.9 kg/mol relative to polystyrene (PS) standards and Mw/Mn=1.20.

Synthesis of —OH End Functional poly(methylmethacrylate-random-dodecafluoroheptylmethacrylate)-OH Brush (P(MMA-r-DFHMA)-OH)

A random copolymer hydroxyl end functional brush comprising copoly(methyl methacrylate-random-dodecafluoroheptylmethacrylate) was manufactured with a reactive alcohol end group by adding to a Schlenk flask equipped with a magnetic stirring bar, 4,4'-di-tert-butyl-2,2'-bipyridyl (0.537 g), Cu(I)Br (0.143 g), methyl methacrylate (1.02 g), dodecafluoroheptylmethacrylate (9.05 g), and toluene (10 g) were added. The solution was sparged with argon for 15 minutes and then placed in a preheated oil bath at 90° C. Once the solution had come to equilibrium, the initiator (2-hydroxyethyl 2-bromo-2-methylpropanoate) (0.210 g) was added via syringe and the reaction was stirred at 90° C. After the polymerization was quenched, the mixture was diluted with THF and stirred with ion exchange beads to remove the catalyst. Once the solution was clear, it was filtered, concentrated to 50 wt %, and precipitated into excess cyclohexane. The polymer was collected and dried in a vacuum oven at 60° C. overnight. $^1$H NMR showed the polymer to have a composition of 7 wt % methyl methacrylate and 93 wt % dodecafluoroheptylmethacrylate. Gel-permeation chromatography revealed a Mn=14.9 kg/mol relative to PS standards and Mw/Mn=1.27.

Substrate Preparation

Four different types of brushes were disposed upon different substrates. The brushes had a single hydroxyl functionality at the chain end and included a polystyrene-OH brush (PS-OH), a polydimethylsiloxane-OH brush (PDMS-OH), a poly(methylmethacrylate-random-trifluoroethylmethacrylate)-OH brush (P(MMA-r-TFEMA)-OH) that comprises 31 weight percent trifluoroethylmethacrylate and a poly(methylmethacrylate-random-dodecafluoroheptylmethacrylate)-OH brush (P(MMA-r-DFHMA)-OH) that comprises 93 weight percent dodecafluoroheptylmethacrylate.

The surface of a silicon substrate having a native oxide layer was modified by spin coating thereon a 1.5 wt % (solids) solution of the desired hydroxyl-terminated polymer bush in toluene at 3,000 rpm for 1 minute. The substrate was then placed on a hotplate set at 150° C. for 1 minute. The substrate was then placed on a hot plate set at 250° C. under a nitrogen atmosphere for 20 minutes to attach the deposited brush layer. The substrate was then rinsed with toluene to wash away any unattached polymer by first soaking the substrate in toluene for 1 minute and then spin drying at 3,000 rpm for 1 minute. The substrate was then baked on a hotplate set at 110° C. for one minute.

The hydroxyl-end functional brush polymers were then cast onto a silicon substrate with native oxide, baked at 250° C. for 2 min, rinsed with casting solvent, baked at 130° C. for 60 s to remove residual solvent, and then the surface energy was determined for each brush using a contact angle determination method. The contact angle was measured on a contact angle goniometer by the Sessile Drop method using water (18 ohm deionized water), methylene iodide ($CH_2I_2$), and diethylene glycol. Surface energy including both polar and dispersive components was calculated from the contact angles of each of these solvents using the Owens-Wendt method. The results are reported in units of millijoules per square meter ($mJ/m^2$) and are collected in Table 1.

TABLE 1

| Substrate Surface | Surface Energy ($mJ/m^2$) |
|---|---|
| PS-OH brush | 40.9 |
| P(MMA-r-TFEMA)-OH brush (31% PTFEMA) | 31.7 |
| P(MMA-r-DFHMA)-OH brush (93% PDFHMA) | 20.9 |
| PDMS-OH brush | 17.8 |

Example 2

Synthesis of Comparative Composition (polystyrene-block-polydimethylsiloxane) (PS-b-PDMS)

Into a 500 mL round bottom reactor under an argon atmosphere was added cyclohexane (56 g) and styrene (16.46 g). The contents of the reactor were then warmed to 40° C. A 7.49 g shot of a 0.06 M solution of sec-butyllithium in cyclohexane was then rapidly added to the reactor via cannula, causing the reactor contents to turn yellow-orange. The reactor contents were allowed to stir for 30 minutes. A small portion of the reactor contents was then withdrawn from the reactor into a small round bottomed flask containing anhydrous methanol for gel permeation chromatography analysis of the polystyrene block formed. Then 22.39 g of a 21 wt % solution of freshly sublimed hexamethylcyclotrisiloxane in cyclohexane was transferred to the reactor. The reactor contents were allowed to react for 20 hours. Then dry tetrahydrofuran (93 mL) was added to the reactor and the reaction was allowed to proceed for 7 hours. Chlorotrimethylsilane (1 mL) was then added to the reactor to quench the reaction. The product was isolated by precipitating into 1 L of methanol and filtering. After washing with additional methanol, the polymer was redissolved in 150 mL of methylene chloride, washed twice with deionized water and then reprecipitated into 1 L of methanol. The polymer was then filtered and dried overnight in a vacuum oven at 60° C., yielding 19.7 g. The poly(styrene)-b-poly(dimethyl siloxane) block copolymer product exhibited a number average molecular weight, ($M_n$), of 40 kg/mol; a polydispersity, PDI, of 1.11 and a 22 wt % PDMS content (as determined by $^1H$ NMR).

Thin Film Formation

A PS-b-PDMS block copolymer with Mn=40 kg/mol and 22 wt % PDMS was dissolved in propylene glycol methyl ether acetate (Dowanol® PMA from the Dow Chemical Company) to form a 1.8 wt % solution. The synthesis of the PS-b-PDMS block copolymer is detailed in Example 4 below. The solution was then hand filtered using a 0.2 µm Whatman syringe filter. The filtered solution was then spin coated at 3,061 rpm onto a poly(styrene) brushed substrate to obtain a deposited film thickness of 38.3 nm. The substrate was then baked on a hotplate set at 150° C. for 1 minute. The deposited film was then annealed by placing the substrate on a hotplate set at 290° C. for one hour under a nitrogen atmosphere containing <6 ppm oxygen.

A surface wetting layer of PDMS formed on the annealed film at the atmosphere-film interface. The annealed film was then treated using two consecutive reactive ion etching (RIE) steps using a PlasmaTherm 790i RIE to reveal the block copolymer morphology of the deposited PS-b-PDMS film. First, a short $CF_4$ plasma (10 mT, 50 W) RIE treatment (8 seconds post plasma stabilization) was used to punch through the surface wetting layer of PDMS. Then, an $O_2$ plasma RIE treatment (25 seconds post plasma stabilization) was employed to remove the polystyrene and convert the PDMS to SiOx.

Figure 5:
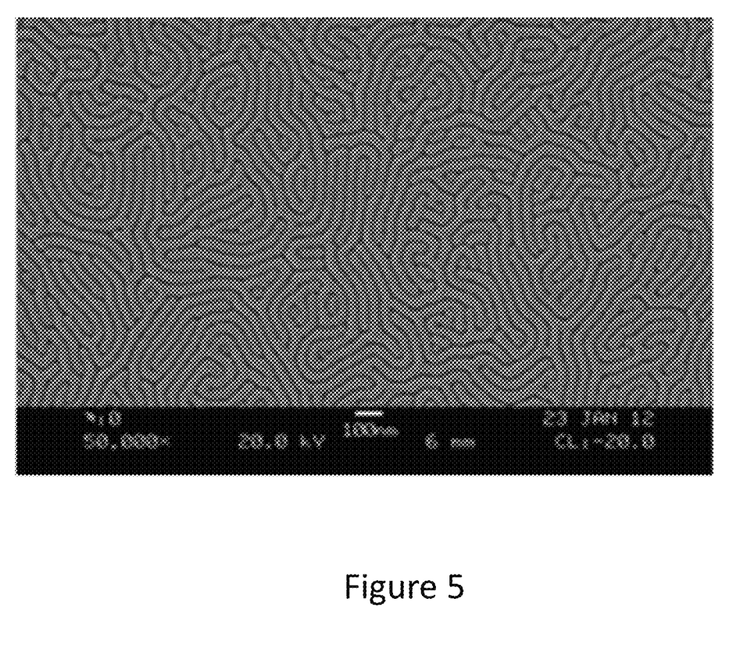
FIG. 5 is a scanning electron photomicrograph for the comparative composition (PS-b-PDMS) depicting the resulting pattern of oxidized PDMS lines having a pitch of 30 nm with short, choppy lines of a relatively low correlation length.

The plasma treated film was then examined by Scanning Electron Microscopy (SEM). The test sample was mounted on the SEM stage using double sided carbon tape and cleaned by blowing nitrogen prior to analysis. Images of the test sample were collected at 50,000× magnification and working distances between 4 and 8. As seen from the SEM image in the FIG. 5, the resulting pattern of oxidized PDMS lines has a pitch of 30 nm with short, choppy lines of relatively low correlation length.

Example 3

This example details film formation and thermal annealing of PtBS-PDMS on PS-brushed silicon substrate.

Synthesis of PtBS-b-PDMS (poly-tert-butylstyrene-b-polydimethylsiloxane) Materials PtBS-b-PDMS (Mn=41.4 kg/mol, 30.3 wt % PDMS) was prepared by first adding cyclohexane (234 g) and t-butylstyrene (55.7 g) to a 1000 mL round bottom reactor under an argon atmosphere. The contents of the reactor were then warmed to 40° C. A 1.84 g shot of a 0.745 M solution of sec-butyllithium in cyclohexane was then rapidly added to the reactor via cannula, causing the reactor contents to turn orange. The reactor contents were allowed to stir for 60 minutes. Then, 0.97 g of 2,2,5,5-tetramethyl-1,2,5-oxadisilolane in cyclohexane (2 mL) was added via cannula, and after a few minutes, a small portion of the reactor contents was then withdrawn from the reactor into a small round bottomed flask containing anhydrous methanol for gel permeation chromatography analysis of the poly(t-butylstyrene) block formed. A solution of freshly sublimed hexamethylcyclotrisiloxane (32.34 g) in cyclohexane (33 mL) was transferred to the reactor, followed by dry tetrahydrofuran (212 g), and the reaction was then allowed to proceed for 16 hours. Chlorotrimethylsilane (1 mL) was then added to the reactor to quench the reaction. The product was isolated by precipitating into 1 L of methanol and filtering. After washing with additional methanol, the polymer was redissolved in 300 mL of methylene chloride, washed twice with deionized water and then reprecipitated into 1 L of methanol. The polymer was then filtered and dried overnight in a vacuum oven at 60° C., yielding 70 g. The PtBS-PDMS block copolymer product exhibited a number average molecular weight, $M_n$, of 41.4 kg/mol; a polydispersity, PDI, of 1.13, and 30.3 wt % PDMS content (as determined by $^1H$ NMR).

Two additional PtBS-b-PDMS materials were similarly prepared according to the above procedure, one having Mn=51,600 grams per mole and 28 wt % PDMS and another with Mn=62,500 grams per mole and 28 wt % PDMS.

Thin Film Formation

A film of PtBS-b-PDMS with Mn=51,600 grams per mole was coated from a solution of PGMEA onto a silicon substrate treated with a polystyrene brush after filtering the solution through a 0.2 µm Whatman syringe filter to give a film thickness of 49.6 nm. The substrate was then baked on a hotplate set at 150° C. for 1 minute. The deposited film was then annealed by placing the substrate on a hotplate set at 290° C. for one hour under a nitrogen atmosphere containing <6 ppm oxygen.

Figure 6:
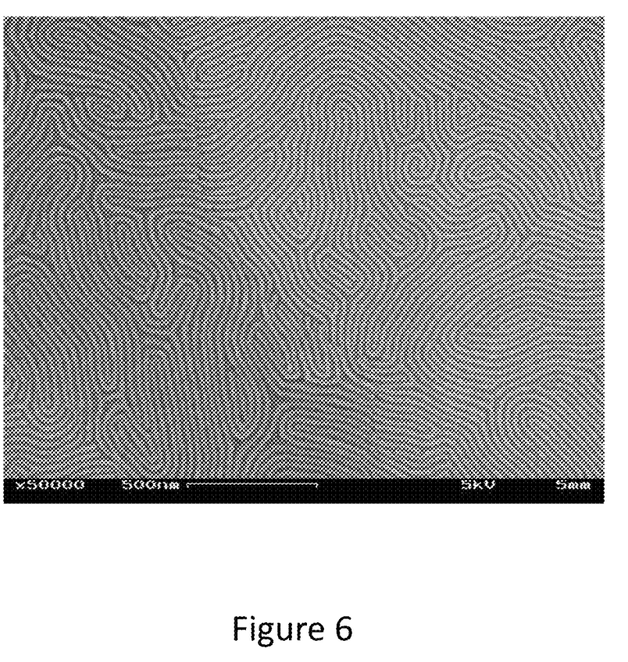
FIG. 6 is a scanning electron photomicrograph depicting a pattern of oxidized PDMS lines (in the PtBS-b-PDMS) sample with straighter lines with longer correlation length despite having a larger pitch, 33 nm, than that observed in the PS-PDMS film, which showed a pitch of 30 nm.

Prior to taking images on a scanning electron microscope (SEM), the annealed sample was first treated with a $CF_4$ plasma flash to remove the surface wetting layer followed by an $O_2$ plasma etch to remove the organic PtBS matrix. SEM images of the sample were taken at a magnification of 50,000× using an Amray 1910 scanning electron microscope. Pitch and correlation length (CL) were determined based on the SEM images using Igor Pro. The SEM image, shown in FIG. 6, revealed a pattern of oxidized PDMS lines with a larger pitch, 33 nm, than observed in the PS-PDMS film, which showed 30 nm. For a given composition of block copolymer, as the pitch increases, the ability to anneal to low defect states decreases due to the stronger segregation strength (higher $\chi N$). Despite having a larger pitch, the pattern provided by this PTBS-b-PDMS are much longer and straighter with higher correlation length than those observed in the PS-b-PDMS sample annealed with the same thermal dose (i.e. the combination of time and temperature). This reveals an advantage of PtBS-b-PDMS over PS-b-PDMS for annealing block copolymers to low defect states at large pitch, for example pitches >30 nm, in reasonable amounts of time.

Example 4

This example was conducted to demonstrate the use of poly(t-butylstyrene)-block-polydimethylsiloxane (PtBS-b-PDMS) copolymers on a substrate that is coated with brushes. Four different types of brushes were disposed upon the substrate. A comparative composition of (polystyrene-block-polydimethylsiloxane) (PS-b-PDMS) was also disposed on the brushes on the substrate. The brushes had a single hydroxyl functionality at the chain end and included a polystyrene-OH brush (PS-OH), a polydimethylsiloxane-OH brush (PDMS-OH), a poly(methylmethacrylate-random-trifluoroethylmethacrylate)-OH brush (P(MMA-r-TFEMA)-OH) that comprises 31 weight percent trifluoroethylmethacrylate and a poly(methylmethacrylate-random-dodecafluoroheptylmethacrylate)-OH brush (P(MMA-r-DFHMA)-OH) that comprises 93 weight percent dodecafluoroheptylmethacrylate.

Thin Film Formation

Two PtBS-b-PDMS materials, one having a number average molecular weight (Mn) of 51,600 grams per mole and 28 wt % PDMS, and the other having an Mn of 62,500 grams per mole and 28 wt % PDMS, were tested on four different brushes grafted on a silicon substrate.

Figure 2:
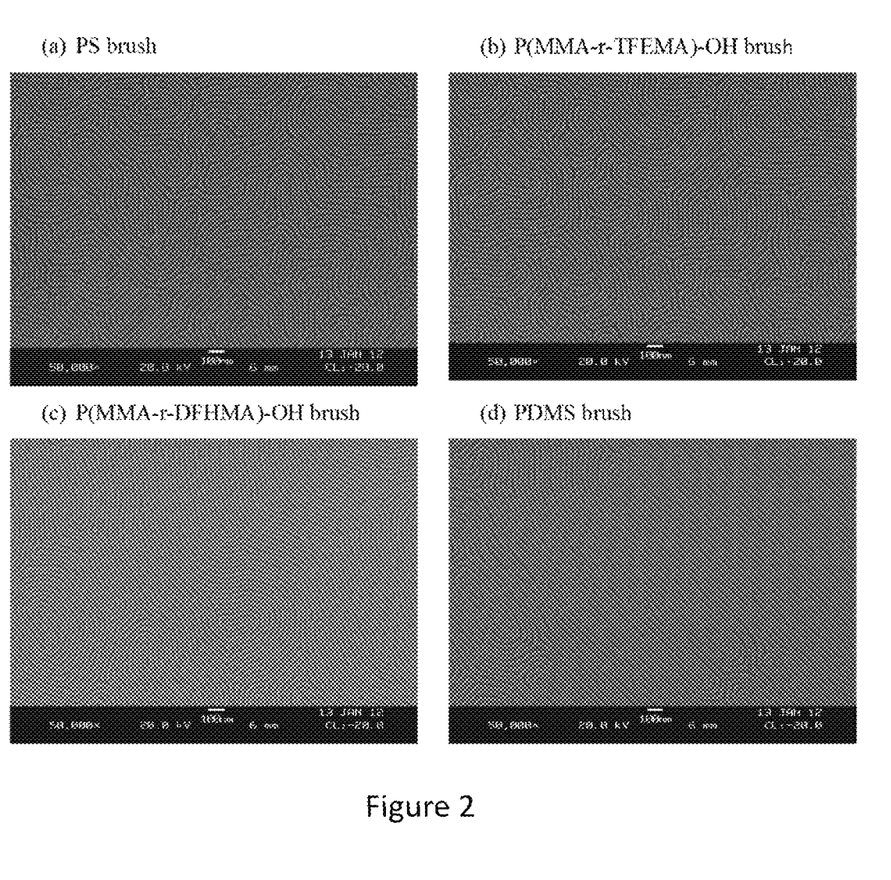
FIG. 2 depicts a series of photomicrographs of the PtBS-b-PDMS disposed on a series of different surfaces (a) polystyrene brushed silicon (b) 65-brushed silicon (c) 67-brushed silicon and (d) polydimethylsiloxane brushed silicon. The PtBS-b-PDMS has a number-average molecular weight of 51,600 grams per mole and 28 wt % PDMS.
Figure 3:
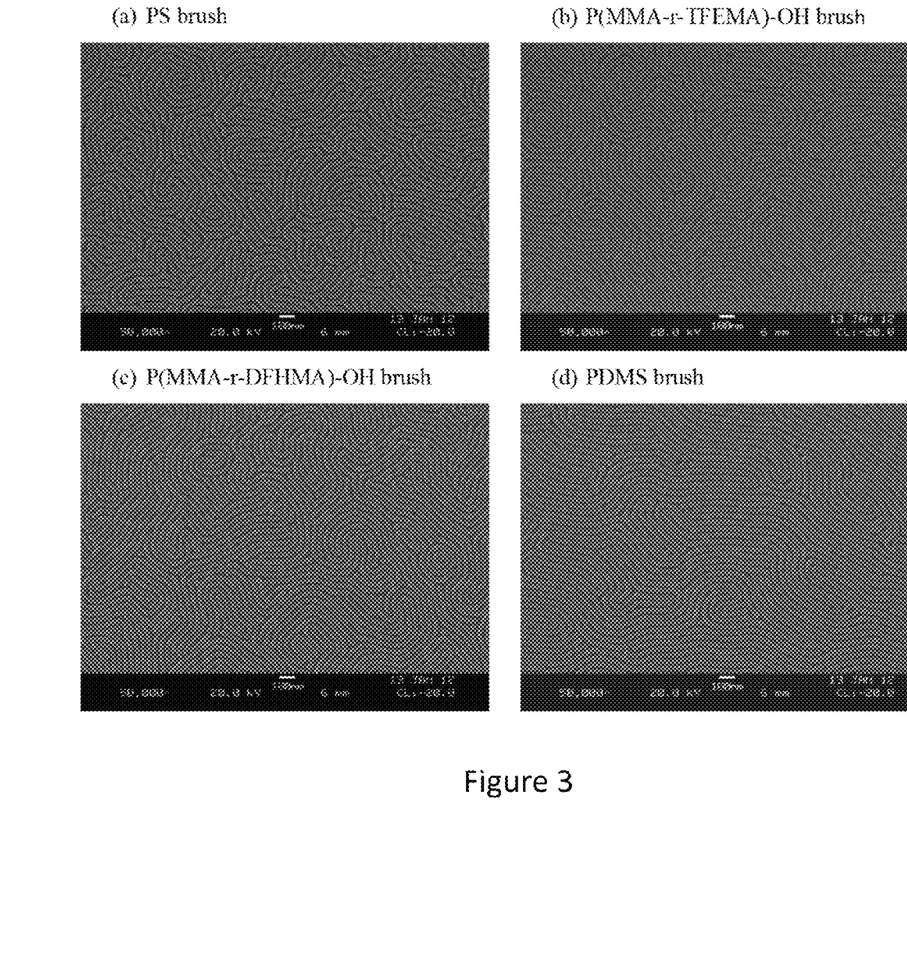
FIG. 3 depicts a series of photomicrographs of the PtBS-b-PDMS disposed on a series of different surfaces (a) polystyrene brushed silicon (b) 65-brushed silicon (c) 67-brushed silicon and (d) polydimethylsiloxane brushed silicon. The PtBS-b-PDMS has a number-average molecular weight of 62,500 grams per mole and 28 wt % PDMS.

PtBS-b-PDMS thin films were coated from a solution of PGMEA onto the silicon substrate and silicon surfaces that were treated with the brushes listed in the Table 1 above. The two different molecular materials, 51,600 grams per mole and 62,500 grams per mole, were annealed at 290° C. and 310° C. for one hour each. Prior to taking images on a scanning electron microscope (SEM), the annealed samples were first treated with a $CF_4$ plasma flash to remove the surface wetting layer followed by an $O_2$ plasma etch to remove the organic PtBS matrix. SEM images of each sample were taken at a magnification of 50,000× using an Amray 1910 scanning electron microscope. Pitch and correlation length (CL) were determined based on the SEM images using Igor Pro. The scanning electron micrographs are shown in the FIGS. 2 and 3. The results from the FIGS. 2 and 3 are summarized in the Tables 2 and 3.

Table 2 shows parameters such as the pitch ($L_0$) in nanometers, the correlation length in nanometers and the film thickness (FT) in nanometers for the PtBS-b-PDMS copolymer with Mn=51,600 grams per mole. The results from Table 2 are plotted in the FIG. 4.

TABLE 2

| Substrate | Film thickness (nm) | $L_0$ (nm) | Correlation length (CL) (nm) |
|---|---|---|---|
| Polystyrene brushed silicon substrate | 49.6 | 33.0 | 59.2 |
| Brush 65 disposed on silicon substrate | 49.8 | 33.0 | 82.2 |
| Brush 67 disposed on silicon substrate | 49.6 | 30.6 | 127 |
| PDMS brushed silicon substrate | 46.5 | 31.8 | 168 |

Table 3 shows parameters such as the pitch (L0) in nanometers, the correlation length in nanometers and the film thickness in nanometers for the PtBS-b-PDMS copolymer with Mn=62,500 grams per mole. The results from Table 3 are plotted in the FIG. 4.

TABLE 3

| Substrate | FT (nm) | $L_0$ (nm) | CL (nm) |
|---|---|---|---|
| Polystyrene brushed silicon substrate | 52.4 | 41.0 | 79.7 |
| Brush 65 disposed on silicon substrate | 53.8 | 40.1 | 94.7 |
| Brush 67 disposed on silicon substrate | 53.7 | 39.1 | 100 |
| PDMS brushed silicon substrate | 59.6 | 41.0 | 112 |

Figure 4:
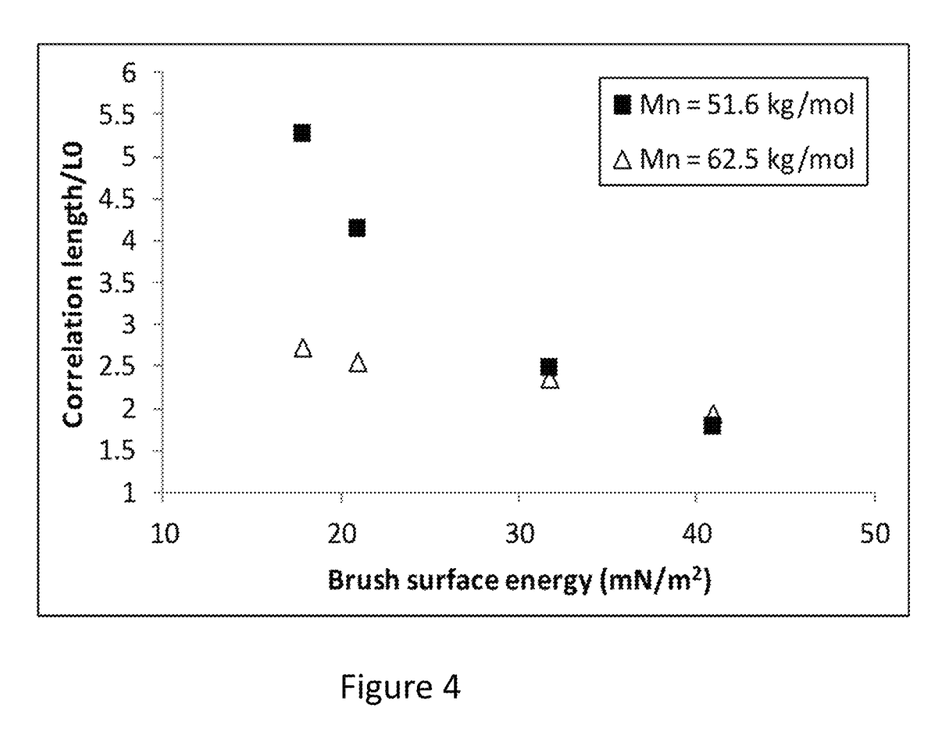
FIG. 4 shows a plot of the correlation length (CL) normalized by pitch (L0) of the PtBS-b-PDMS block copolymer plotted as a function of surface energy of the substrates coated by the four different brushes.

As can be seen in the Tables 2 and 3 and plotted in the FIG. 4, the correlation length (CL) normalized by pitch ($L_0$) increases inversely with surface energy. This shows that brush surface energy provides a useful means to controlling self assembly kinetics. This shows that in addition to increasing the thermal dose (i.e. increasing annealing temperature and time), surface energy also provides another means to controlling self-assembly kinetics.

The block copolymer disclosed herein can be used for manufacturing articles such as semiconductors, field effect transistors, and the like.

What is claimed is:
1. A block copolymer comprising:
   a first block derived from a vinyl aromatic monomer; where the vinyl aromatic monomer has at least one alkyl substitution on an aromatic ring;

a second block derived from a siloxane monomer; where a chi parameter that measures interactions between the first block and the second block is 0.03 to 0.18 at a temperature of 200° C.

2. The block copolymer of claim 1, where the vinyl aromatic monomer is an alkylstyrene.

3. The block copolymer of claim 2, where the alkylstyrene is o-methylstyrene, p-methylstyrene, m-methylstyrene, o-ethylstyrene, m-ethylstyrene, p-ethylstyrene, α-methyl-p-methylstyrene, 2,4-dimethylstyrene, iso-propyl styrene, propyl styrene, butyl styrene, tert-butylstyrene, sec-butylstyrene, isobutylstyrene, 4-tert-butylstyrene, or a combination comprising at least one of the foregoing alkylstyrenes.

4. The block copolymer of claim 1, where the first block comprises poly(4-tertbutyl styrene) and has a molecular weight of 2,000 to 200,000 grams per mole.

5. The block copolymer of claim 1, where the siloxane monomer has a structure represented by formula (1)

(1)

wherein each R is independently a $C_1$-$C_{10}$ alkyl, a $C_3$-$C_{10}$ cycloalkyl, a $C_6$-$C_{14}$ aryl, a $C_7$-$C_{13}$ alkylaryl or a $C_7$-$C_{13}$ arylalkyl and where a degree of polymerization n in the formula (1) is to 5,000.

6. The block copolymer of claim 1, where the second block comprises polydimethylsiloxane.

7. The block copolymer of claim 1, where the block copolymer comprises cylindrical and/or lamellar domains and has an interdomain spacing of less than or equal to about 50 nanometers.

8. The block copolymer of claim 1, where the block copolymer is annealed to a temperature of up to 400° C. for up to 4 hours.

9. The block copolymer of claim 1, where the block copolymer is annealed to a temperature of 270 to 330° C. for 0.5 minutes to 2 hours.

10. An article formed from the block copolymer of claim 1.

11. A method comprising:
polymerizing a vinyl aromatic monomer to form a first block, wherein the vinyl aromatic monomer has at least one alkyl substitution on an aromatic ring; and
polymerizing a second block onto the first block to form a block copolymer; where the second block is derived by polymerizing a siloxane monomer; and where the block copolymer has a chi parameter of 0.03 to 0.18 at a temperature of 200° C.; where the chi parameter is a measure of interactions between the first block and the second block of the copolymer.

12. The method of claim 11, where the first block is anionically polymerized.

13. The method of claim 12, where the second block is polymerized by condensation polymerization.

14. The method of claim 11, further comprising disposing the block copolymer on a substrate.

15. The method of claim 11, further comprising annealing the block copolymer on a substrate; where the annealing is conducted at a temperature of up to 400° C. for up to 4 hours.

* * * * *